(12) United States Patent
Harada

(10) Patent No.: US 6,465,055 B2
(45) Date of Patent: Oct. 15, 2002

(54) APPARATUS FOR ELIMINATING IMPURITIES BY OZONE GENERATED IN SPACE ABOVE SUBSTRATE SURFACE AND FILM FORMING METHOD AND SYSTEM THEREWITH

(75) Inventor: Koji Harada, Kumamoto-ken (JP)

(73) Assignee: Tokyo Electron Limited, Tokyo (JP)

( * ) Notice: Subject to any disclaimer, the term of this patent is extended or adjusted under 35 U.S.C. 154(b) by 3 days.

(21) Appl. No.: 09/742,536

(22) Filed: Dec. 22, 2000

(65) Prior Publication Data

US 2001/0000477 A1 Apr. 26, 2001

Related U.S. Application Data

(62) Division of application No. 09/145,617, filed on Sep. 2, 1998, now Pat. No. 6,190,458.

(30) Foreign Application Priority Data

Sep. 8, 1997 (JP) ............................................. 9-260853

(51) Int. Cl.[7] .............................. B05D 3/06; B05D 3/10; B08B 5/04; B08B 7/04
(52) U.S. Cl. ........................ 427/553; 427/240; 216/66; 134/1; 134/1.3
(58) Field of Search .................... 156/345; 118/715, 118/724, 695, 52, 722; 134/902, 1.2, 1.3; 427/553, 534, 558, 240; 216/66

(56) References Cited

U.S. PATENT DOCUMENTS

| | | | |
|---|---|---|---|
| 4,857,382 A | * | 8/1989 | Liu et al. ..................... 428/156 |
| 4,904,328 A | * | 2/1990 | Beecher et al. |
| 5,078,851 A | * | 1/1992 | Nishihata et al. ...... 204/298.34 |
| 5,510,158 A | * | 4/1996 | Hiramoto et al. ........... 427/553 |
| 5,518,542 A | * | 5/1996 | Matsukawa et al. .......... 118/52 |
| 5,565,034 A | | 10/1996 | Nanbu et al. |
| 5,622,896 A | * | 4/1997 | Knotter et al. ............... 427/553 |
| 5,707,754 A | * | 1/1998 | Morinville et al. .......... 134/1.3 |
| 5,725,664 A | | 3/1998 | Nanbu et al. |
| 6,319,321 B1 | * | 11/2001 | Hiraga et al. ................ 427/553 |

FOREIGN PATENT DOCUMENTS

JP  7-201843  8/1995

* cited by examiner

*Primary Examiner*—Marianne Padgett
(74) *Attorney, Agent, or Firm*—Oblon, Spivak, McClelland, Maier & Neustadt, P.C.

(57) ABSTRACT

In this impurity eliminating apparatus, a mounting stand on which a wafer is mounted and a casing which confronts the mounting stand are provided in a container. A lower face of the casing consists of quartz glass. Inside the casing, an irradiating body for irradiating ultraviolet rays toward the wafer on the mounting stand is provided. The casing is full of inactive gas atmosphere supplied from an inactive gas supply pipe. The atmosphere above the wafer is exhausted from one side by an exhauster. Following the treatment by the impurity eliminating apparatus with the above structure, coating treatment with a treatment solution for forming a SOG film is performed. Thus, organic substances on the surface of the wafer is eliminated to form the SOG film.

5 Claims, 3 Drawing Sheets

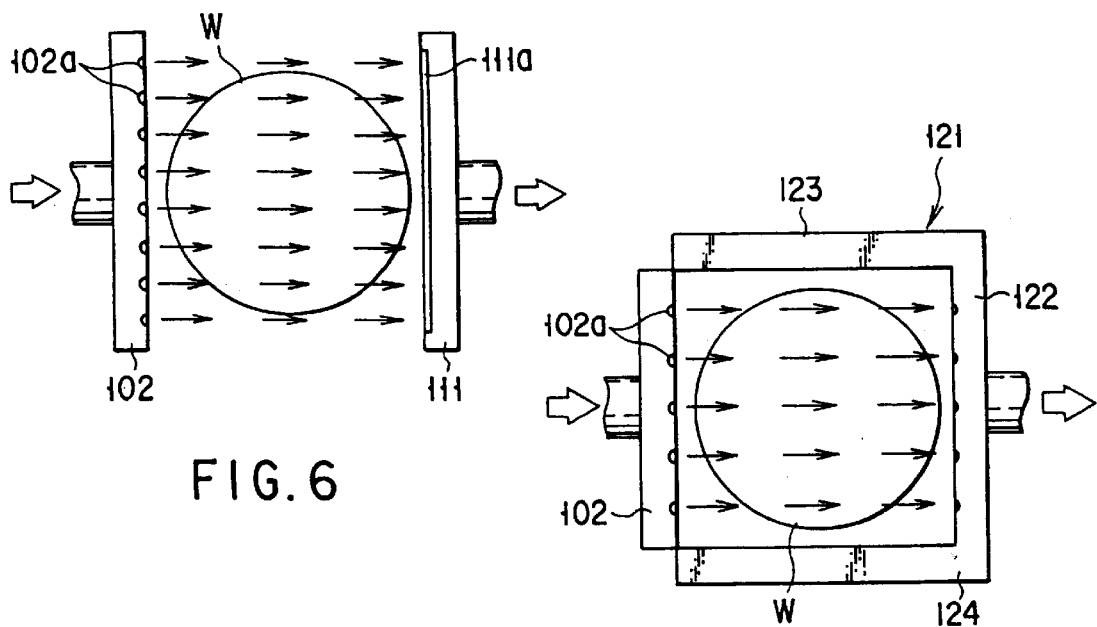
FIG. 6
FIG. 7
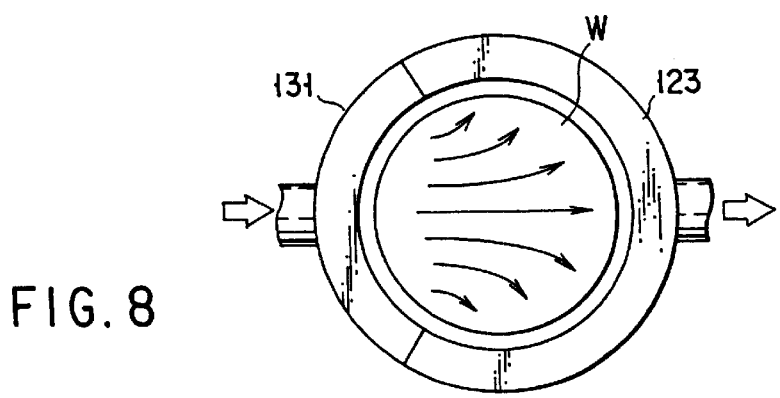
FIG. 8
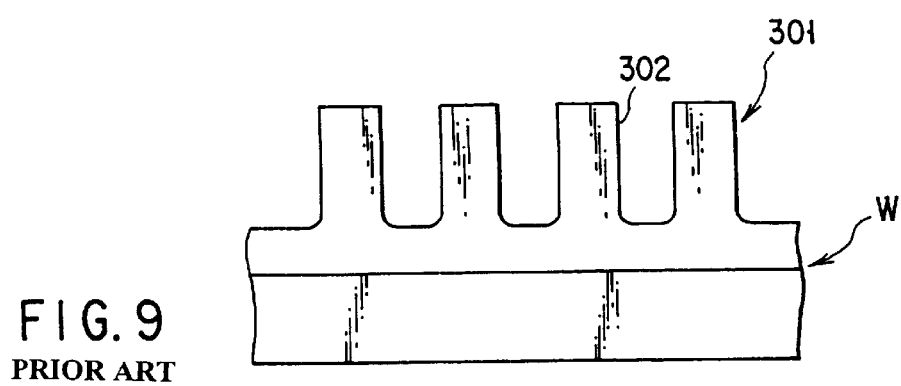
FIG. 9
PRIOR ART

APPARATUS FOR ELIMINATING IMPURITIES BY OZONE GENERATED IN SPACE ABOVE SUBSTRATE SURFACE AND FILM FORMING METHOD AND SYSTEM THEREWITH

This application is a division of application Ser. No. 09/145,617 filed on Sep. 2, 1998, now U.S. Pat. No. 6,190,458, issued Feb. 20, 2001.

BACKGROUND OF THE INVENTION

1. Field of the Invention

The present invention relates to an impurity eliminating apparatus for eliminating impurities on a surface of a substrate, a film forming apparatus, and a film forming method.

2. Discussion of the Background

For example, in a process of semiconductor device fabrication, a process for forming a SOG (Spin-on-Glass) film has been performed for an interlayer insulating film or flattening so far. Specifically, a treatment solution called sauce made by dissolving SiOx in alcohol is supplied onto the surface of a substrate such as a semiconductor wafer (referred to as "a wafer" hereinafter) and at the same time the substrate is spun to form a film by the treatment solution on the substrate surface. Thereafter, the substrate is heated twice to volatilize a solvent in the treatment solution and moreover baked. Thus, a predetermined interlayer insulating film is formed on the surface of a wafer and the substrate surface is flattened.

In a conventional process for forming a SOG film, after a wafer is taken out from a cassette storing wafers and carried to an apparatus in which a treatment solution is supplied and coated, for example, a spin coating apparatus so as to be coated with the treatment solution, the wafer is carried to a heating apparatus including a baking apparatus or a vertical type furnace where after predetermined heating treatment is performed for volatilization of a solvent and baking.

If the wafer itself taken from the cassette is, however, carried to the spin coating apparatus to be treated with the treatment solution as described above, so-called "wettability" is not satisfactory due to impurities such as organic substances adhering to the surface of the wafer and there is a possibility of causing problems in the subsequent fixing characteristic or fixing state of the SOG film. Besides, when the wafer W before forming the SOG film is in a state that the bottom corner portions of sidewalls 302 in a pattern 301 after being etched remain roundish as shown in FIG. 9, there is a possibility of exerting a bad influence on treatment for the wafer after having formed the SOG film, for example, formation of a conductive film, an oxidation insulating film, or the like.

Therefore, it is conceivable that the surface of a wafer is cleaned in advance, but in scrub cleansing or high-pressure jet cleaning used in a conventional film forming method such as a resist film forming method, organic substances on the wafer surface can not be fully eliminated and the aforementioned state that bottom corners remain roundish can not be solved. In addition, a process for drying is required thereafter, which is undesirable in respect of throughput.

BRIEF SUMMARY OF THE INVENTION

An object of the present invention is to provide an apparatus and a method by which organic substances adhering to the surface of a substrate such as a wafer can be effectively eliminated when a SOG film is formed, for example, and such elimination of impurities can be easily and swiftly performed.

To solve the above problem, the first aspect of the present invention is an apparatus for eliminating impurities from a surface of a substrate including a mounting stand on which the substrate is mounted, an irradiating body for irradiating a predetermined wavelength of light to the substrate mounted on the mounting stand and generating ozone in space above the substrate surface, a casing for storing the irradiating body, a penetrating body disposed on a face opposite to the mounting stand in the casing for making the predetermined wavelength of light penetrate, and means for exhausting atmosphere in a space between the mounting stand and the casing.

The second aspect of the present invention is a film forming apparatus including an impurity eliminating apparatus provided with a mounting stand on which a substrate is mounted, an irradiating body for irradiating a predetermined wavelength of light to the substrate mounted on the mounting stand and generating ozone in space above the substrate surface, a casing for storing the irradiating body, a penetrating body disposed on a face opposite to the mounting stand in the casing for making the predetermined wavelength of light penetrate, and means for exhausting atmosphere in a space between the mounting stand and the casing, a film forming apparatus for supplying a predetermined treatment solution to the substrate to form a predetermined film on the substrate, and a carrier apparatus for carrying the substrate which completed the treatment in the impurity eliminating apparatus to the film forming apparatus.

The third aspect of the present invention is a film forming method including the steps of eliminating impurities on a surface of a substrate by means of an impurity eliminating apparatus provided with a mounting stand on which the substrate is mounted, an irradiating body for irradiating a predetermined wavelength of light to the substrate mounted on the mounting stand and generating ozone in space above the substrate surface, a casing for storing the irradiating body, a penetrating body disposed on a face opposite to the mounting stand in the casing for making the predetermined wavelength of light penetrate, and means for exhausting atmosphere in a space between the mounting stand and the casing, and supplying a predetermined treatment solution to the substrate to form a predetermined film on the substrate.

In the present invention, if an apparatus is disposed so that a space between a casing and a substrate will be full of air atmosphere, ozone is generated from oxygen in air between a penetrating body in the casing and the substrate by irradiation of light from an irradiating body. The generated ozone eliminates organic substances adhering to the substrate surface and solves the state that bottom corners of sidewalls in a pattern remain roundish. In addition, the above process is a so-called dry type eliminating process so that a succeeding drying process is unnecessary unlike a wet type. Accordingly, simple and swift elimination of impurities is possible. Besides, means for exhausting atmosphere in the space between the mounting stand and the casing is provided, whereby the generated ozone never diffuses to the surroundings and an in-line system in combination with other apparatus can be easily constructed. Naturally, an improvement in a contact angle on a surface of a substrate such as wafer can be realized, since impurities such as organic substances adhering to the substrate surface can be eliminated as described above.

Additional objects and advantages of the invention will be set forth in the description which follows, and in part will be obvious from the description, or may be learned by practice of the invention. the objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention, wherein:

FIG. 6 is a plane view of a gas feeder and an exhauster used in the impurity eliminating apparatus in FIG. 5;

FIG. 7 is a plane view of another gas feeder and another exhauster usable for the impurity eliminating apparatus in FIG. 5;

FIG. 8 is a plane view of another arc-shaped gas feeder and another arc-shaped exhauster usable for the impurity eliminating apparatus in FIG. 5; and FIG. 9 is an explanatory view showing a pattern in a state that bottom corners of sidewalls of the pattern remain roundish.

DETAILED DESCRIPTION OF THE INVENTION

Figure 1:
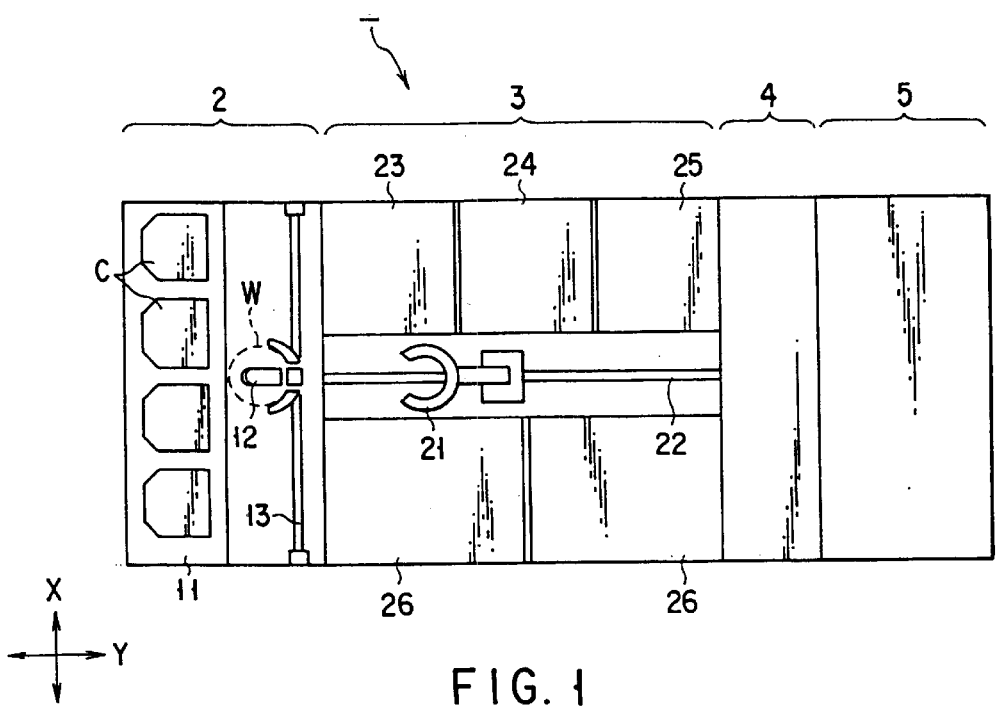
FIG. 1 is an explanatory view of a plane of a SOG forming system according to an embodiment of the present invention.

FIG. 1 is a plane view of a SOG forming system 1 as a film forming system according to an embodiment of the present invention. The SOG forming system 1 mainly includes a load/unload unit 2, a coating unit 3, an interface unit 4, and a heating furnace 5.

In the load/unload unit 2, a mounting portion 11 on which more than one cassette C for storing more than one wafer W to be treated can be freely mounted, and a sub-carrier apparatus 12 for taking out the wafers from the cassettes C or conversely putting the same therein are disposed. The sub-carrier apparatus 12 is movable on a carrier path 13 disposed along the direction of disposition of the cassettes C (X-direction) in the load/unload unit 2 and also movable in a vertical direction. An alignment mechanism for aligning the wafers W is also provided in the sub-carrier apparatus 12.

In the coating unit 3, a carrier path 22 for a main carrier apparatus 21 is disposed in the longitudinal direction thereof, that is, in a direction perpendicular to the carrier path 13 for the sub-carrier apparatus 12 (Y-direction). The main carrier apparatus 21 can freely send and receive the wafer W to/from the sub-carrier apparatus 12. Various treatment apparatus necessary for performing coating treatment for the wafer W, that is, an impurity eliminating apparatus 23 for eliminating impurities on the surface of the wafer W, a heating apparatus 24 for heating the wafer to volatilize a solvent, a cooling apparatus 25 for cooling the wafer W to a predetermined temperature, and coating apparatus 26 and 26 for coating a treatment solution by means of a so-called spin coating method are disposed on both sides across the carrier path 22. The main carrier apparatus 21 can freely carry the wafer W in/out from each of the above treatment apparatus.

In the heating apparatus 24 and the cooling apparatus 25, heating units and cooling units, both of which give treatment for the wafers W one by one, are respectively multi-tiered and more than one wafer W can be treated at the same time. Incidentally, a heat-treatment apparatus 26 having the multistage structure in which the heating units are disposed above and the cooling units are disposed below is also available. If the heating units are disposed above and the cooling units are disposed below, mutual thermal interference can be prevented.

The coating apparatus 26 includes therein a rotary stand, a nozzle for supplying a treatment solution to the wafer W on the rotary stand, a nozzle rinse for cleaning the nozzle, a cup rinse for cleaning a cup encircling the rotary stand, and the like. (None of them are shown.) The coating apparatus has functions of supplying a treatment solution made by dissolving $SiO_x$ in alcohol onto the surface of the wafer W and at the same time coating the treatment solution by spinning the wafer W by means of a spin coating method.

The interface unit 4 has a structure to function as an interface for transferring the wafer W between the coating unit 3 and the heating furnace 5. The heating furnace 5 is provided with a furnace, for example, a vertical type furnace for baking the wafer W at a predetermined temperature, for example, at 400° C. to 700° C. to form a predetermined SOG film after a solvent in the treatment solution coated in the coating apparatus 26 is volatilized in the heating apparatus 24.

Figure 2:
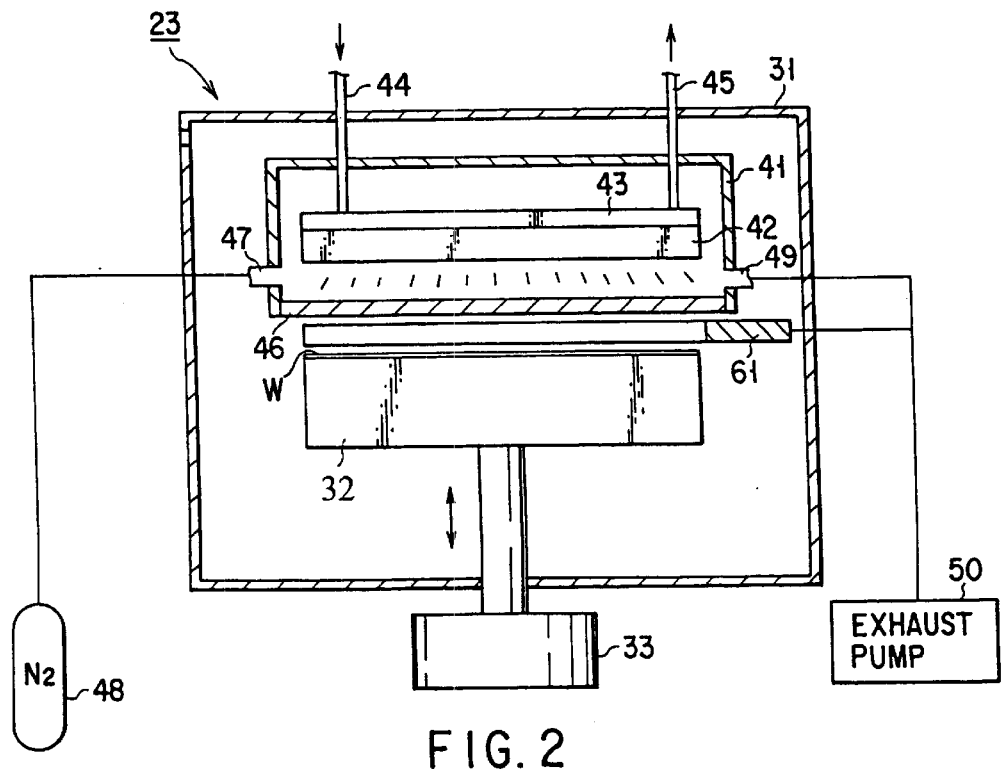
FIG. 2 is an explanatory view of a vertical section of an impurity eliminating apparatus used in the SOG forming system in FIG. 1.

The impurity eliminating apparatus 23 has a structure shown in FIG. 2. Specifically, the impurity eliminating apparatus 23 has a mounting stand 32 for mounting the wafer W within a container 31 of which the outside is covered non-airtightly. The mounting stand 32, includes an excellent corrosion resistant-material, for example, stainless steel and is vertically movable with an ascending and descending mechanism 33 provided outside the container 31 as shown with a reciprocating arrow in FIG. 2. Provided in the mounting stand 32 is an ascending and descending pin which is free to protrude from the surface of the mounting stand 32 when the wafer W is sent and received. A way in/out for carrying in/out wafers is formed on a side surface of the container 31 and a shutter which can be freely opened and closed is provided in the way in/out.

A casing 41, a lower surface of which is open, is disposed at a position opposite to the mounting stand 32 in an upper portion within the container 31. An irradiating body 42 is provided inside the casing 41. In this embodiment, a dielectric barrier discharge excimer lamp which irradiates ultraviolet rays with a wavelength of 172 nm is used as the irradiating body 42. A cooling mechanism 43 for cooling such as a water jacket is attached to the irradiating body 42. Cooling water at a predetermined temperature, for example at 23° C. is supplied at a predetermined flow rate, for example at 3 liters per minute from a cooling water supply pipe 44 to the cooling mechanism 43 and the supplied cooling water is discharged to the outside at 3 liters per minute through a cooling water discharge pipe 45 after cooling the irradiating body 42 by circulating through it, whereby the overheated state of the irradiating body 42 can be prevented.

A quartz glass plate 46 as a penetrating body which makes ultraviolet rays with a wavelength of 172 nm penetrate is provided airtightly in an opening portion of the lower face of the casing 41, thereby airtightly closing the casing 41.

An inactive gas supply pipe 47 is provided through a side plate on one side of the casing 41 and a predetermined inactive gas, for example $N_2$ (nitrogen gas) is supplied at a predetermined flow rate, for example, at 10 liters per minute from an inactive gas supply source 48 toward a pace between the irradiating body 42 and the quartz glass plate 46. An exhaust pipe 49 is provided through a side plate on the other side of the casing 41 and atmosphere in the space between the irradiating body 42 and the quartz glass plate 46 is exhausted at 10 liters per minute by operation of an exhaust means 50 such as an exhaust pump disposed outside the container 31. Accordingly, the inside of the casing 41, especially the space between the irradiating body 42 and the quartz glass plate 46 is always full of fresh $N_2$ atmosphere. Incidentally, a rare gas such as Ar (argon) gas, He (helium) gas, and Ne (neon) gas as well as $N_2$ can be used as inactive gas.

When the mounting stand 32 is raised and set at a predetermined treatment position, an exhauster 61 is disposed to enclose the space between the quartz glass plate 46 on the lower surface of the casing 41 and the wafer W mounted on the mounting stand 32. The exhauster 61 can be disposed by being supported by a sidewall of the container 31 or by attaching to the lower surface of the casing 41 or an upper edge portion of the mounting stand 32.

Figure 3:
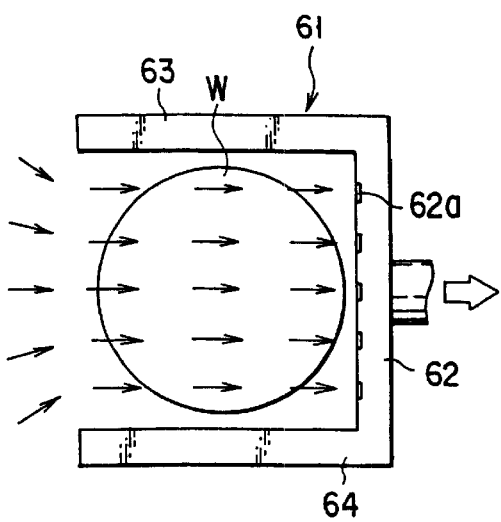
FIG. 3 is a plane view of an exhauster used in the impurity eliminating apparatus in FIG. 2.

As shown in FIG. 3, the exhauster 61 is large enough to enclose the wafer W on three sides, a plane surface thereof has an almost C-shape, and includes an almost bar-shaped exhaust portion 62 and bar-shaped side shielding portions 63 and 64 extending perpendicularly from both end portions of the exhaust portion 62. A large number of exhaust vents 62a are formed in the front of the exhaust portion 62, that is, on a side facing the wafer W. The exhaust vents 62a communicate with the exhaust means 50. The atmosphere in the space between the lower surface of the quartz glass plate 46 and the upper surface of the wafer W is absorbed from the exhaust vents 62a of the exhaust portion 62 and exhausted to the outside by operation of the exhaust means 50 as shown in FIG. 3.

An ultraviolet lamp or the like can be used as the irradiating body 42 which generates ozone.

The casing 41 preferably is formed, for example, of excellent ozone corrosion-resistant material, for example, Teflon resin such as stainless steel or PTFE (poly.tetra.fluoro.ethylene).

The SOG forming system 1 according to this embodiment is structured as described above and an example of its operation will be explained hereinafter. After the cassette C storing the wafer W to be treated is mounted on the mounting portion 11, by the sub-carrier apparatus 12 the wafer W in the cassette C is taken out and sent to the main carrier apparatus 21 after being aligned. The main carrier apparatus 21 first carries the received wafer W into the container 31 of the impurity eliminating apparatus 23.

In the impurity eliminating apparatus 23, when the wafer W is carried in, the mounting stand 32 is already on standby after descending. After the wafer W is mounted on the mounting stand 32 and the main carrier apparatus 21 recedes, the mounting stand 32 ascends to the treatment position. Incidentally, the exhauster 61 is already in operation and atmosphere within the container 31 is being exhausted. Subsequently, a process for eliminating impurities on the surface of the wafer W is started.

Specifically, when ultraviolet rays with a wavelength of 172 nm are irradiated from the irradiating body 42 to the wafer W after penetrating the quartz glass plate 46, ozone is generated from air (atmospheric air) between the lower surface of the quartz glass plate 46 and the upper surface of the wafer W. Impurities such as organic substances on the upper surface of the wafer W are eliminated by the ozone, and the generated ozone and the like are altogether exhausted from the exhaust portion 62. As is described above, since the container 31 is non-airtightly composed, if the generated ozone and the like are exhausted from the exhaust portion 62 of the exhauster 61, air in atmosphere flows into the container 31, especially into the space between the lower surface of the quartz glass plate 46 and the upper surface of the wafer W, that is, the area irradiated by ultraviolet rays with a wavelength of 172 nm. At this time, ozone is generated from oxygen in air by the ultraviolet rays and impurities such as organic substances on the upper surface of the wafer W are eliminated by the ozone.

In the above case, the exhauster 61 is provided with side shielding portions 63 and 64 on both sides of the exhaust portion 62 which actually performs exhaust, whereby the flow of air which flows in is well-ordered as shown in FIG. 3, thereby preventing the generated ozone from diffusing to the surroundings. As a result, there is no possibility of other members in the container 31 being corroded by ozone. The exhaust portion 62 and the side shielding portions 63 and 64 which compose the exhauster 61 are, however, exposed to ozone. Hence, it is preferable that they are made of an excellent ozone corrosion-resistant material, for example, PTFE. In this case, if the ozone corrosion-resistant material is used selectively for a portion near the exhaust portion 62 to which the generated ozone flows, there is no problem practically.

Further, an area irradiated by ultraviolet rays from the irradiating body 42 within the casing 41 is always full of fresh $N_2$ atmosphere as described above so that ozone will not be generated. Thus, the inside of the casing 41 will never be corroded by ozone.

Figure 4:
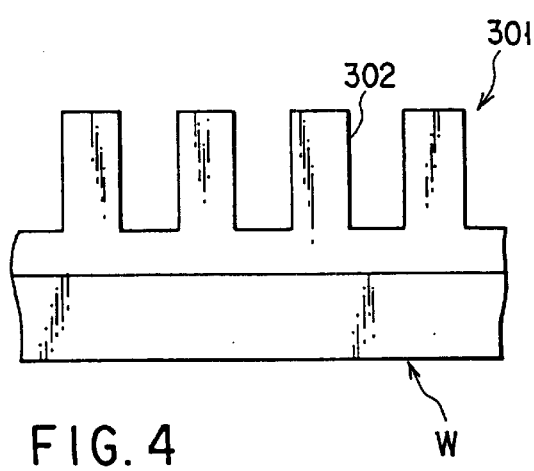
FIG. 4 is an explanatory view showing the state of a pattern after impurities are eliminated by the impurity eliminating apparatus in FIG. 2.

After the wafer W is treated by the impurity eliminating apparatus 23 in the aforementioned way, impurities such as organic substances are eliminated from the surface of the wafer W, thereby improving wattability and a contact angle thereof. Even if a pattern after being etched is in a state that bottom corners thereof remain roundish as shown in FIG. 9, it is possible that roundish portions remaining in the bottom corners of sidewalls 302 in a pattern 301 are removed to make a preferable state shown in FIG. 4. Accordingly, a succeeding coating treatment by treatment solution can be suitably performed.

Moreover, air in atmosphere is utilized as a generation source of ozone in the impurity eliminating apparatus 23. Therefore, it is not necessary to prepare a gas source separately as a generation source of ozone. In addition, the container 31 is of a non-airtight type so that air in the atmosphere can be flow into the desirable space, which makes it possible to hold down both initial costs and running costs.

After being treated by the impurity eliminating apparatus 23, the wafer W is taken out again by the main carrier apparatus 21 and carried to the coating apparatus 26 to be coated with a predetermined treatment solution by means of the spin coating method. The wafer W with the completed coating of the treatment solution in the coating apparatus 26 is carried by the main carrier apparatus 21 to the heating apparatus 24 where the solvent in the treatment solution is volatilized. After completing the above volatilizing treatment, the wafer W is cooled to a predetermined temperature in the cooling apparatus 25 and subsequently mounted on the interface unit 4. Thereafter, the wafer W is given baking treatment of the treatment solution in the heating furnace 5, thereby forming a SOG film.

Incidentally, the aforementioned treatment is a process in accordance with an example of a recipe. Accordingly, if the elimination rate of impurities by ozone is raised, for example, by providing a heating apparatus for heating the wafer W inside the mounting stand 32 in the impurity eliminating apparatus 23 and heating the wafer W, the wafer W may be carried once to the cooling apparatus 25 after completing the treatment in the impurity eliminating apparatus 23, and may be carried to the coating apparatus 26 after being cooled to a predetermined temperature.

Figure 5:
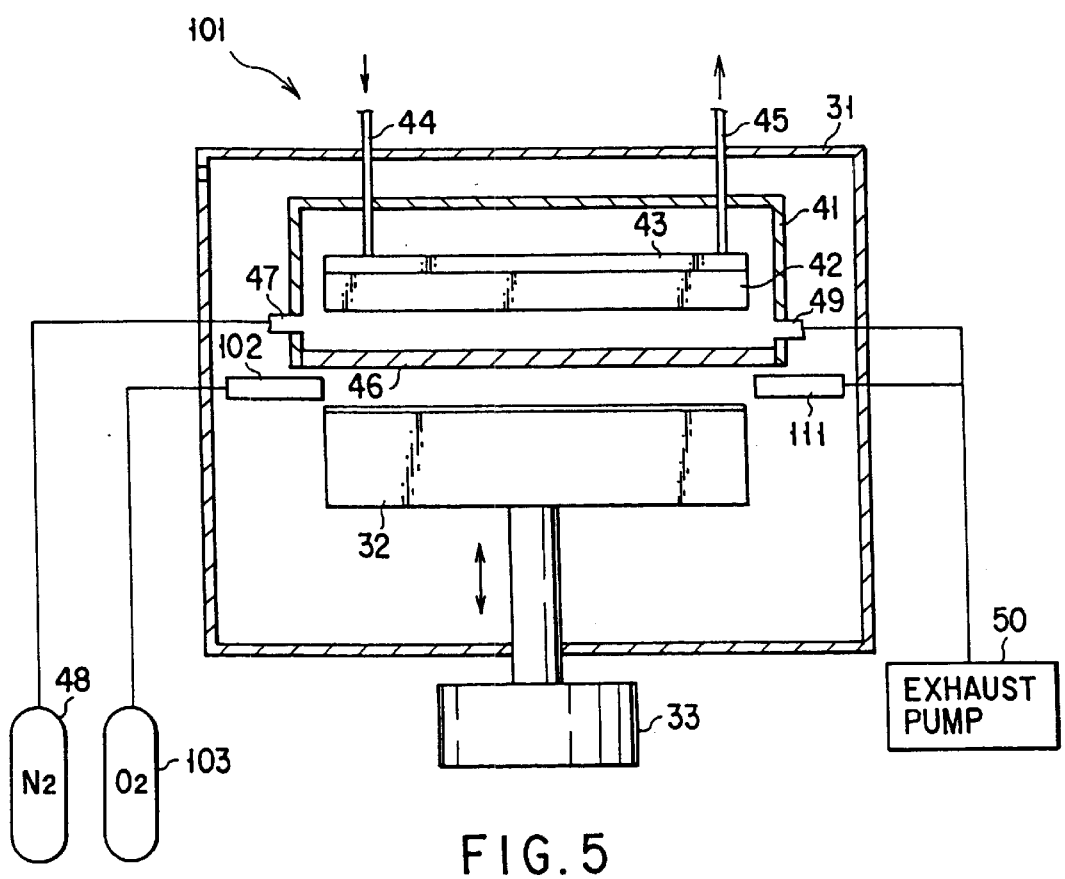
FIG. 5 is an explanatory view of a vertical section of another impurity eliminating apparatus.

In the impurity eliminating apparatus 23 which is used in the above embodiment, a gas source for ozone generation is not particularly used. Instead of this apparatus, however, an impurity eliminating apparatus 101 shown in FIG. 5 may be used. Incidentally, in FIG. 5 and the following description, members and the like shown with the same reference numerals and symbols as those used in the above embodiment shows the same members and the like.

The impurity eliminating apparatus 101 is provided with a bar-shaped gas feeder 102, the plane view of which is shown in FIG. 6, for supplying gas as an ozone generation source toward the space between the lower surface of the quartz glass plate 46 of the casing 41 and the upper surface of the wafer W. The gas feeder 102 is structured to blow out gas as an ozone generation source, for example, an oxygen gas, which is supplied from a gas supply source 103 disposed outside the container 31, from supply ports 102a of the gas feeder 102 in a direction parallel to the wafer W, that is, horizontally.

An exhauster 111, a plane of which has an almost bar-shape as shown in FIG. 6, is disposed at a position opposite to the gas feeder 102 across the wafer W. An exhaust vent 111a of the exhauster 111 has a slit-shape.

According to the impurity eliminating apparatus 101 with such a structure, horizontal laminar flow of oxygen gas is formed between the lower surface of the quartz glass plate 46 and the upper surface of the wafer W and ultraviolet rays are irradiated from the irradiating body 42 toward the horizontal laminar flow of oxygen gas, which makes the generation rate of ozone high. As a result, the elimination rate of impurities is higher than that of the above impurity eliminating apparatus 23. Naturally, the generated ozone and the like are altogether exhausted from the exhaust vent 111a of the exhauster 111 and hence they never diffuse to the surroundings, thereby obtaining fine uniformity of the impurity eliminating treatment itself.

As an exhauster to be combined with the gas feeder 102, an exhauster 121 shown in FIG. 7 having the same plane surface of C-shape as the exhauster 61 may be used. Specifically, the exhauster 121 is also large enough to enclose the wafer W on three sides, a plane surface thereof has an almost C-shape, and include an almost bar-shaped exhaust portion 122 having exhaust vents 122a and bar-shaped side shielding portions 123 and 124 extending perpendicularly from both end portions of the exhaust portion 122. Forward end portions of the side shielding portions 123 and 124 are respectively attached to end portions of the gas feeder 102.

According to the gas feeder 102 and the exhauster 121 with the aforementioned structure, as compared with the example shown in the above FIG. 6, the amount of entrance of surrounding atmosphere is less and higher ozone generation rate can be achieved. Moreover, diffusion of ozone to the surroundings is further reduced.

The plane shapes of a gas feeder and an exhauster described above, with a so-called tightly joined relationship, are not respectively limited to a rectilinear shape or an almost C-shape, but may be an arc-shape which can encircle the wafer W. FIG. 8 shows an example of such a case. A plane shape of a gas feeder 131 is an almost one third arc and that of an exhauster 132 is a two thirds arc. Both end portions of both apparatus are tightly joined to each other. Also in the combination of the gas feeder 131 and the exhauster 132, similarly to the example shown in FIG. 7, the amount of entrance of surrounding atmosphere is less and higher ozone generation rate can be achieved. Naturally, diffusion of ozone to the surroundings is prevented.

Furthermore, to stop surrounding atmosphere from entering, to prevent ozone from diffusing, and besides to raise the elimination rate of impurities under a still higher rate of ozone generation, a gas feeder and an exhauster with a tightly jointed relationship as shown in FIG. 7 and FIG. 8 are tightly attached respectively to an edge portion of the lower surface of the casing 41 or an edge portion of the upper surface of the mounting stand 32 so that the above purpose can be attained by making the space enclosed with the gas feeder and the exhauster airtight when the mounting stand 32 ascends.

The above impurity eliminating apparatus 23 and 101 are used for a SOG film forming system, but they can be used also for cleaning treatment of a substrate which is a stage previous to an other film forming treatment and solution treatment, since they can effectively eliminate impurities such as organic substances on the surface of the wafer W and improve a pattern in the state the bottom corners thereof remain roundish. Naturally, a LCD substrate or other substrates as well as a wafer may be used.

According to the present embodiments, if an apparatus is disposed so that the space between a casing and a substrate will be full of air atmosphere, ozone is generated from oxygen in air between a penetrating body in the casing and the substrate by irradiation of light from an irradiating body. The generated ozone eliminates organic substances adhering to the surface of the substrate and solves the state that bottom corners in a pattern remain roundish. In addition, it is a so-called dry type eliminating process so that a succeeding drying process is unnecessary unlike a wet type. Accordingly, simple and swift elimination of impurities is possible. Besides, means for exhausting atmosphere in the space between the mounting stand and the casing is provided, whereby the produced ozone never diffuses to the surroundings and an in-line system in combination with other apparatus can be easily constructed. Naturally, an improvement in a contact angle on a surface of a substrate such as wafer can be realized, since impurities such as organic substances adhering to the substrate surface can be eliminated as described above.

Generated ozone or ozone after eliminating impurities is exhausted from one side, which improves design of the exhaust means and degree of freedom on disposition thereof.

When consideration is given to ozone corrosion resistance around the mounting stand, it is sufficient that consideration is given only to a portion near the exhaust means (namely, a portion on the downstream side of exhaust).

Means for supplying gas containing at least oxygen from one side toward the space between the mounting stand and the casing as well as means for exhausting atmosphere from the other side toward the space between the mounting stand and the casing is provided, which further prevents produced ozone or the like from diffusing to the surroundings. In addition, gas containing at least oxygen is actively supplied to the space between the mounting stand and the casing, whereby ozone generation efficiency is satisfactory and thus impurity elimination efficiency is further improved. Gas containing at least oxygen may be naturally $O_2$ (oxygen gas) or may be air.

Incidentally, in the present embodiments it is preferable that means for exhausting atmosphere in the space between the mounting stand and the casing from one side and means for supplying gas containing at least oxygen from the other side toward the space between the mounting stand and the casing respectively have a shape along a portion of an external form of a substrate and the external form of the substrate can be enclosed by the above two means. A shape along a portion of the external form of the substrate may be an arc shape seen from above in each means, for example if the substrate is a wafer, and if the substrate is a glass substrate for LCD, for example, the supply means may have a rectilinear shape and the exhaust means may have an almost C-shape seen from above. In such a case, if both means are tightly joined each other so as to enclose the substrate and at the same time tightly attached to the casing so as to make the space between the mounting stand and the casing closed, the diffusion of ozone to the surroundings can be completely prevented. Moreover, it is isolated from atmosphere in surrounding other space, thereby raising ozone generation efficiency and further improving elimination efficiency of impurities.

If an inactive gas supply means for supplying an inactive gas toward at least a space between the irradiating body and the penetrating body in the casing and an exhaust means for exhausting atmosphere in the space are further added, corrosion in the casing is prevented.

If either the mounting stand or the casing is structured to be movable vertically, a substrate can be smoothly carried and mounted between the mounting stand and a carrying means and the most suitable ozone generation rate to satisfy conditions and the like can be selected. Incidentally, the generation rate or decomposition half-life of ozone is greatly influenced by temperature. Therefore, if a heating mechanism or cooling mechanism for controlling the temperature of a substrate is provided, the impurity elimination efficiency by ozone can be controlled and succeeding treatment can be performed swiftly.

According to a film forming method in the present embodiments, when a SOG film is formed, for example, organic substances and the like on the surface of a substrate can be effectively eliminated in advance, thus improving wettability and a state that bottom corners in a pattern remain roundish. Consequently, fixing characteristic and fixing state of the SOG film is improved, which enables suitable forming treatment of the SOG film. In addition, since the aforementioned impurity eliminating treatment is performed in dry atmosphere, coating treatment by a treatment solution can be performed immediately after the impurity eliminating treatment, which makes it possible to prevent a decrease in throughput.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film forming method comprising the steps of:

(a) preparing an impurity eliminating apparatus, which comprises a mounting stand on which a substrate is substantially horizontally mounted, an ultraviolet lamp for irradiating the substrate mounted on the mounting stand with ultraviolet light having a predetermined wavelength, thereby generating ozone in a space above a surface of the substrate, a casing for housing the ultraviolet lamp, an inert gas supplying mechanism including a gas supply pipe communicating with the casing for supplying an inert gas into the casing through the gas supply pipe, a transmission plate attached to the casing so as to face the substrate mounted on the mounting stand, the transmission plate allowing the ultraviolet light to be transmitted through the transmission plate, exhaust means including a suction and exhaust port that opens in a vicinity of a periphery of the substrate mounted on the mounting stand, and an exhaust pipe communicating with the casing, for exhausting gas from the space between the casing and the substrate through the suction and exhaust port so as to generate a stream of an oxygen-including gas flowing in a direction parallel to the space and for exhausting gas from the casing through the exhaust pipe;

(b)(i) generating a stream of the inert-gas flowing from the gas supply pipe toward the exhaust pipe in the casing by exhausting gas from the casing through the exhaust pipe while supplying the inert gas from the inert gas supplying mechanism through the gas supply pipe to the casing, (ii) generating the stream of the oxygen-including gas in the space by exhausting gas from the space through the suction and exhaust port by the exhaust means, and (iii) removing impurities from a surface of the substrate using said impurity eliminating apparatus; and (c) forming a coating film on the substrate by supplying a treatment solution to the substrate after the step (b).

2. A film forming method according to claim 1, wherein in step (c), a spin-on glass film is formed on the surface of the substrate by rotating the substrate and supplying the treatment solution to the substrate while the substrate is rotating.

3. A film forming method according to claim 1, wherein the suction and exhaust port comprises a plurality of exhaust vents arranged in series, and in the step (b), the stream of the oxygen-including gas flowing substantially parallel to the surface of the substrate is generated in the space by suction and exhaust through the exhaust vents.

4. A film forming method according to claim 1, wherein the suction and exhaust port is slit-shaped, and in the step (b), the stream of the oxygen-including gas flowing substantially parallel to the surface of the substrate is generated in the space by suction and exhaust though the slit-shaped suction and exhaust port.

5. A film forming method according to claim 1, further comprising a step of supplying oxygen gas to the space.

* * * * *